(12) United States Patent  
Yagi et al.

(10) Patent No.: US 8,124,543 B2  
(45) Date of Patent: Feb. 28, 2012

(54) METHOD FOR MANUFACTURING SEMICONDUCTOR LASER DIODE

(75) Inventors: Hideki Yagi, Yokohama (JP); Kenji Koyama, Yokohama (JP); Hiroyuki Yoshinaga, Yokohama (JP); Kuniaki Ishihara, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/785,860

(22) Filed: May 24, 2010

(65) Prior Publication Data  
US 2010/0303115 A1 Dec. 2, 2010

(30) Foreign Application Priority Data  
May 27, 2009 (JP) .................................. 2009-128158

(51) Int. Cl.  
*H01L 21/302* (2006.01)

(52) U.S. Cl. .. 438/737; 438/712; 438/735; 257/E21.218

(58) Field of Classification Search .................. 438/712, 438/737, 735; 257/E21.218  
See application file for complete search history.

(56) References Cited

FOREIGN PATENT DOCUMENTS  
JP  2003-298190  10/2003

*Primary Examiner* — Bradley K Smith  
*Assistant Examiner* — Amar Movva  
(74) *Attorney, Agent, or Firm* — Smith, Gambrell & Russell, LLP

(57) ABSTRACT

A method for manufacturing an LD is disclosed. The LD has a striped structure including an optical active region. The striped structure is buried with resin, typically benzo-cyclobutene (BCB). The method to form an opening in the BCB layer has tri-steps etching of the RIE. First step etches the BCB layer partially by a mixed gas of $CF_4$ and $O_2$, where $CF_4$ has a first partial pressure, second step etches the photo-resist patterned on the top of the BCB layer by a mixed gas of $CF_4$ and $O_2$, where $CF_4$ in this step has the second partial pressure less than the first partial pressure, and third step etches the BCB left in the first step by mixed gas of $CF_4$ and $O_2$, where $CF_4$ in this step has the third partial pressure greater than the second partial pressure.

14 Claims, 8 Drawing Sheets

METHOD FOR MANUFACTURING SEMICONDUCTOR LASER DIODE

BACKGROUND OF THE INVENTION

1. Field of the Invention

The present invention relates to a method for manufacturing a semiconductor laser diode (hereafter denoted as LD), in particular, the invention relates to a method to form a dulled side surface of an opening to provide an electrode of the LD.

2. Related Background Art

A Japanese Patent Application published as JP-2003-298190A has disclosed an LD with the ridge waveguide structure. Such an LD with the striped structure like the ridge waveguide often causes damage to the striped structure during the process. Accordingly, the LD disclosed therein has provided a pair of protrusion with a height greater than a height of the ridge in both sides of the ridge. The protrusion provided in both side of and apart from the ridge may operate as a protection means for the striped structure.

However, the protrusion structure is necessary to carry out several process steps, namely, first forming a patterned photo-resist by the lithography and subsequent etching to form the protrusion. Moreover, when the protrusion is formed before the formation of the striped structure, the protrusion with the height greater than that to be formed for the striped structure sometimes influences patterning of the photo-resist for the striped structure. The photo-lithography for a bumpy surface sometimes upsets the preciseness of the photo-resist pattern. A modified process for an LD has been suggested, in which a resin with low viscosity buries the striped structure and forms a planar top surface thereof. The planar resin layer may effectively protect the striped structure.

In such a planar structure by the resin layer, an electrical contact to the active portion of the LD is realized by forming an opening in the resin layer in a top of the striped structure. However, the planarization by the resin is necessary to form the resin thick enough, which results in a deeper opening and causes a breakage of the wiring to the active region of the LD at a corner of the opening in the thick resin.

SUMMARY OF THE INVENTION

A method for manufacturing an LD according to one embodiment of the present invention comprises steps of: (1) forming a striped structure including a stack having a plurality of semiconductor layers; (2) covering the striped structure with an inorganic layer containing silicon; (3) burying the striped structure and the inorganic layer by a resin so as to make a top surface thereof planar, wherein the resin contains silicon by a substantial concentration; and (4) forming an opening in the resin and the inorganic layer at a portion on the striped structure by a photo-resist as an etching mask, wherein the photo-resist is free from silicon or contains silicon by a concentration less than the substantial concentration for the resin. The method has features that the formation of the opening comprises (i) first etching of the resin partially by the RIE (Reactive Ion Etching) with a mixed gas of carbon fluorine ($CF_4$) and oxygen ($O_2$) under the first partial pressure for $CF_4$ with respect to $O_2$, (ii) second etching of the photo-resist by the RIE using a mixed gas of $CF_4$ and $O_2$ under the second partial pressure of $CF_4$ with respect to $O_2$, which is less than the first partial pressure, (iii) third etching of the resin again by the RIE with a mixed gas of $CF_4$ and $O_2$ under the third partial pressure for $CF_4$ with respect to $O_2$, which is greater than the second partial pressure, and (iv) fourth etching of the top of the inorganic layer covering the striped structure by the RIE with a mixed gas of $CF_4$ and $O_2$ under the fourth partial pressure for $CF_4$.

According to the embodiment of the invention, the resin covering the top of the striped structure is etched by the tri-step etching, which makes the side wall of the opening in the resin dull enough to prevent a breakage of the wiring traversing the edge of the opening and coming in contact with the top of the striped structure.

The tri-step etching according to the present embodiment may be carried out by using the mixed gas of $CF_4$ and $O_2$, but the ratio of the partial pressure for $CF_4$ is different in respective steps, in particular, the ratio of the partial pressure for $CF_4$ in the second etching directed to the photo-resist with respect to that of $O_2$ is less than the ratio of the partial pressure for $CF_4$ with respect to $O_2$ in the first etching. The etching rate for material containing silicon by the mixed gas of $CF_4$ with $O_2$ depends on the concentration of silicon thereof. In the embodiment of the invention, the resin layer contains silicon by a substantial concentration, while, the photo-resist on the resin layer is free from silicon or contains silicon by a concentration less than that of the resin layer, the tri-step etching may be carried out by the same etching gas but the ratio of the partial pressure for $CF_4$ is varied in respective steps.

Moreover, the tri-step etching of the present embodiment interposes the etching only for the photo-resist between the etchings for the resin layer. This intermediate etching for the photo-resist may expand or widen the opening provided in the patterned photo-resist. Then, the tri-step etching of the embodiment may make the side surface of the opening in the resin layer dull. Accordingly, the edge of the opening becomes dull, which may effectively prevent the wiring traversing the edge and the side surface of the opening from breaking.

The ratio of the partial pressure for $CF_4$ to $O_2$ in the first etching for the resin partially preferably ranges from 0.8 to 1.0, the ratio of the partial pressure for $CF_4$ in the second etching for the photo-resist preferably ranges from 0.2 to 0.33, and the ratio of the partial pressure for $CF_4$ in the third etching for the resin preferable ranges from 0.8 to 1.0 with respect to the partial pressure for $O_2$.

The mixed gas of $CF_4$ with $O_2$ may etch the resin layer with a substantial etching rate, while, the mixed gas of $CF_4$ with $O_2$ but the partial pressure of $CF_4$ is less than the former etching may etch the photo-resist effectively and, because the etching gas contains $CF_4$, silicon oxides generated by a reaction of oxygen in the etching gas with materials containing in the resin layer may be effectively removed by the reaction with $CF_4$.

Another aspect of the present invention relates to an arrangement of an LD. The LD of the embodiment comprises: (1) a semiconductor stack provided on a semiconductor substrate, wherein the semiconductor stack has a striped structure not including an active layer, (2) a resin layer that fills grooves formed in both sides of the striped structure and has a planar surface with an opening in a position corresponding to the striped structure, (3) a wiring provided on the planar surface of the resin and in the opening of the opening so as to come in electrically contact with the semiconductor stack at the striped structure. A feature of the arrangement of the LD according to the embodiment is that the opening has a dulled side surface such that a width thereof gradually increases from the top of the semiconductor stack to the planar surface of the resin layer.

Because of the dulled side surface of the opening in the resin layer, the wiring formed so as to come in contact with the semiconductor stack and to traverse the edge of the opening to extend on the planar surface of the resin layer may be effectively prevented from breakage at the edge of the opening.

BRIEF DESCRIPTION OF DRAWINGS

The foregoing and other purposes, aspects and advantages will be better understood from the following detailed description of a preferred embodiment of the invention with reference to the drawings, in which.

DETAILED DESCRIPTION OF THE PREFERRED EMBODIMENTS

Figure 1:
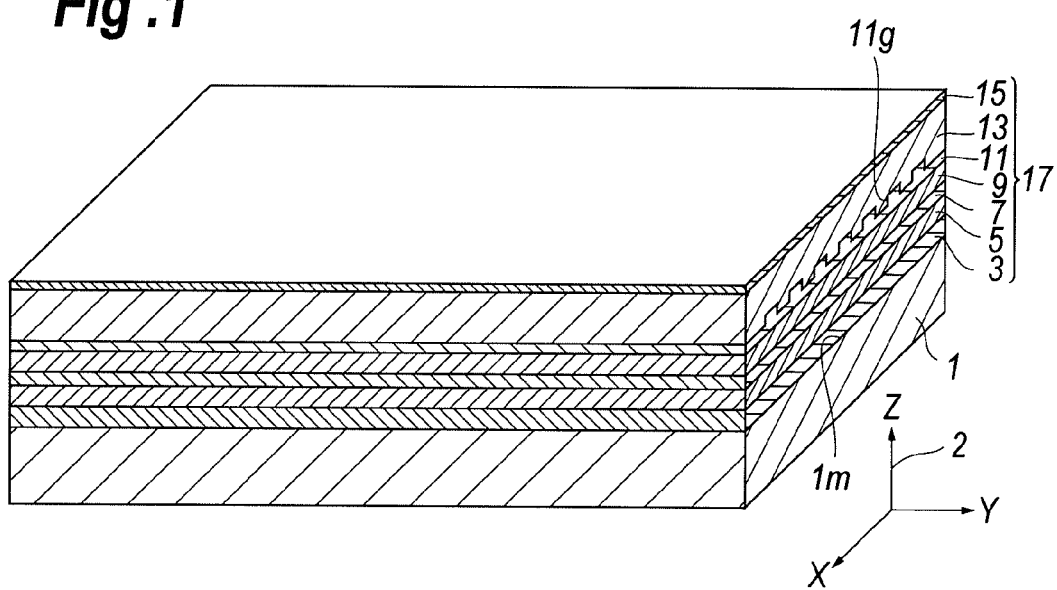
FIG. 1 schematically shows a cross section of a semiconductor laser diode to explain a process thereof according to the first embodiment of the invention.

Next, preferred embodiments for the manufacturing process and the structure of the LD according to the present invention will be described as referring to accompanying drawings. In the description of the drawings, the same elements will be referred by the same symbols or the same numerals without overlapping explanations. The aspect ratio of respective elements appeared in the drawings are set to be optional, not always reflecting their practical dimensions, for the explanation sake.

First Embodiment

First, a process to form an LD 100 and a structure according to the first embodiment of the invention will be described by concentrating on an LD with the ridge waveguide structure. FIG. 1 is a schematic cross drawing of the LD according to the present embodiment; FIGS. 2 to 11 sequentially explain the process of the LD by the cross sections thereof; and FIG. 12 is a perspective view of the LD 100.

(Layer Growth)

The process according to the embodiment first grows a plurality of semiconductor layers by, for instance, a conventional metal organic chemical vapor deposition (MOCVD) technique on a primary surface 1m of the semiconductor substrate 1. The stacked semiconductor layers include a lower cladding layer 3, a lower optical confinement layer 5, an active layer 7, an upper optical confinement layer 9, a grating layer 11, an upper cladding layer 13 and a contact layer 15 in this order on the semiconductor substrate 1. The explanation presented below assumes that directions parallel to the primary surface 1m of the semiconductor substrate 1 are X-direction and Y-direction, respectively, while the direction perpendicular to the primary surface 1m is Z-direction.

The semiconductor substrate 1 may have the first conduction type, for instance, the n-type and may be made of InP. The stacking of the semiconductor layers, 3 to 15, which will be collectively referred as the stacking 17, provides a primary structure for the LD. Specifically, the lower cladding layer 3 has the first conduction type and may be made of InP; the lower optical confinement layer 5 may have also the first conduction type and may be made of GaInAsP; the active layer 7 may have the structure of the multiple-quantum well (MQW) structure or the Single quantum well structure (SQW) having the well layer with a thickness of 6 nm and the barrier layer with a thickness of 9 nm each being made of GaInAsP but the compositions thereof are different from the other. The upper optical confinement layer 9 may be made of un-doped GaInAsP.

The grating layer 11 may have the second conduction type, for instance the p-type when the first conduction type is the n-type, and may be made of GaInAsP. The grating layer 11 includes the diffraction grating 11g formed by the process, for instance, combining the electron beam lithography and the dry-etching. The diffraction grating 11g includes a periodic corrugated pattern with projections and hollows along the X-direction, while, the projections and the hollows extend along the Y-direction. The upper cladding layer 13 may have the second conduction type and may be made of InP. This upper cladding layer 13 buries the grating layer 11; specifically, the upper cladding layer 13 is filled in the hollows of the grating layer 9 and covers both the projections and the hollows so as to form the top surface thereof planar. The contact layer 15 may also have the second conduction type and may be made of GaInAs. Another embodiment of the stacking 17 according to the present invention may include, on the n-type GaAs substrate, the active layer with the quantum well structure made by GaInNAs or the quantum dot structure made of InAs. The lower and upper optical confinement layers, 5 and 9, may be omitted for a simplified layer structure, and the grating layer 11 may be also omitted for the LD with the Fabry-Perot type.

(Stripe Formation)

Figure 2:
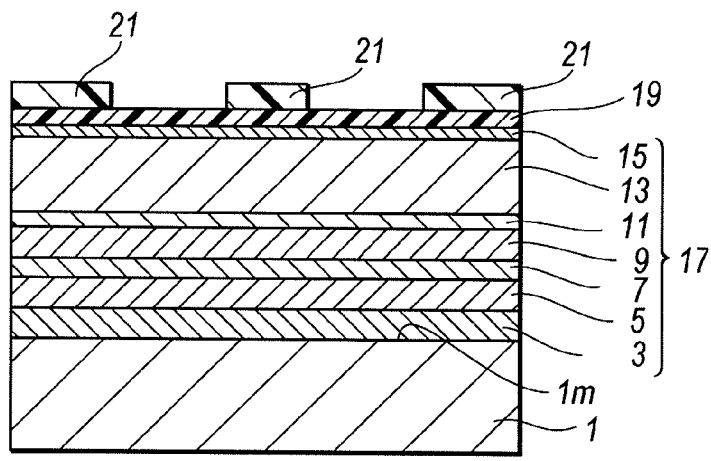
FIG. 2 schematically shows a process for the LD subsequent to that shown in FIG. 1, in which a photo-resist is patterned on the top of the semiconductor stack.

Next, on the contact layer 15 is formed with an insulating layer 19 made of silicon nitride (SiN) and a patterned photo-resist 21, as shown in FIG. 2. The insulating layer 19 may be formed by the chemical vapor deposition (CVD) technique. The photo-resist 21 may be formed by a conventional technique comprising, a spin-coating of the photo-resist on the insulating layer 19, an exposure and a developing thereof. The pattern of the photo-resist 19 reflects the stripe for the ridge waveguide 17R, appeared in FIG. 3, with a plurality of stripes extending along X-direction with a constant width.

Figure 3:
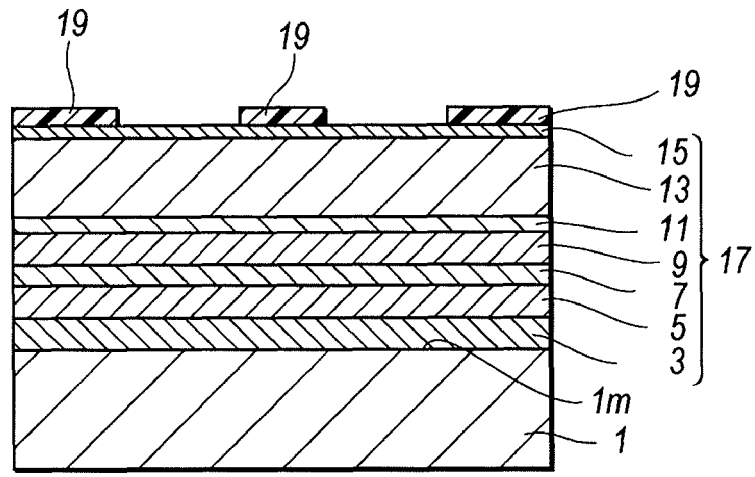
FIG. 3 schematically shows a process for the LD subsequent to that shown in FIG. 2, in which an inorganic film on the top of the semiconductor stack is etched by the photo-resist as an etching mask.

The reactive ion etching (RIE) copies the striped patterns of the photo-resist on the insulating layer 19 by using carbon-fluoride ($CF_4$) as the reactive gas and the photo-resist as the etching mask, as shown in FIG. 3. Subsequently, the process removes the photo-resist 21 by the ashing using oxygen ($O_2$) gas and the subsequent process using organic solvent. Thus, the insulating layer 19 appears the pattern reflecting the ridge waveguide 17R with a plurality of stripes each extending along the X-direction and having the constant width.

Figure 4:
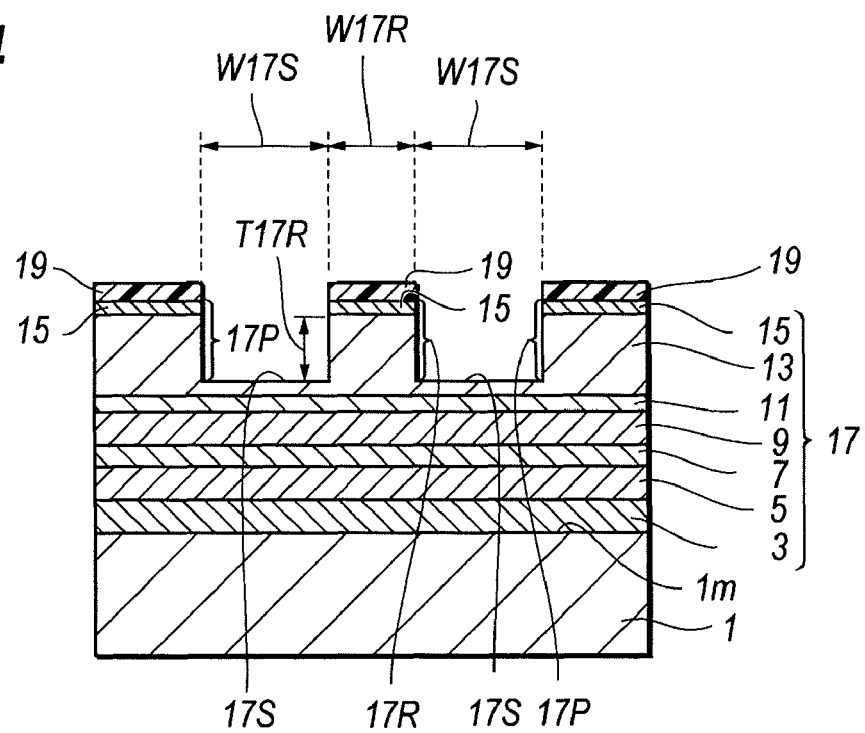
FIG. 4 schematically shows a process for the LD subsequent to that shown in FIG. 3, in which a striped structure and terrace structures are formed by an etching.

Subsequently, the contact layer 15 and a portion of the upper cladding layer 13 are dry-etched by using the patterned insulating layer 19 as the etching mask, as shown in FIG. 4. When the stack 17 contains semiconductor materials involved within the InP group, the dry-etching may be carried out by a mixed gas of carbon hydride ($CH_4$) with hydrogen ($H_2$), while, the stack contains semiconductor materials involved within the GaAs group, the chloride ($Cl_2$) or the chloroform ($CCl_4$) may be used as the etching gas. The InP group or the GaAs group mean a semiconductor material able to be grown on the InP or the GaAs, respectively; namely, the semiconductor material with a lattice constant substantially equal to or mismatched thereto within a few percent of that of InP or GaAs.

The process may thus form the ridge waveguide 17R, a pair of grooves 17S each arranged in respective sides of the ridge waveguide 17R and terrace regions 17P apart from the ridge waveguide 17R by the groove 17S. The ridge waveguide 17R includes the contact layer 15 and a portion of the upper cladding layer 13, extends along the X-direction and has the constant width W17R. The grooves 17S put the ridge waveguide 17R therebetween, also extend along the X-direction, and also has the constant width W17S. The ridge waveguide 17R may have a width W17R from 1.0 to 2.0 μm, and a height T17R of, which is equivalently equal to a depth of the upper cladding layer 13, of 2.0 to 1.8 μm. On the other hand, the grooves 17S may have a width W17S of 10 to 15 μm. The process may carry out a slight wet-etching of the upper cladding layer 13 to remove a damaged layer by the dry etching.

(Protection Layer Formation)

Figure 5:
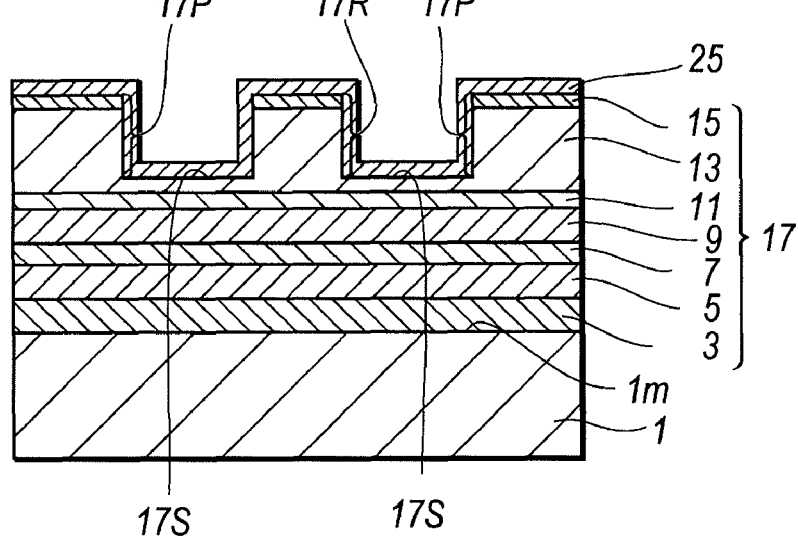
FIG. 5 schematically shows a process for the LD subsequent to that shown in FIG. 4, in which the striped structure and terrace structures are fully covered by another inorganic layer.

As shown in FIG. 5, the process may form, after the removal of the insulating layer 19 by using the fluoric acid, another insulating layer 25 made of, for instance $SiO_2$, on the whole surface of the stack 17, namely, on the side of the ridge 17R, on the top of the grooves 17S, and on the top of the ridge 17R and that of the terrace 17P. The new insulating layer 25 may be formed by the CVD technique by a thickness of 200 to 400 nm.

(Surface Flattening)

Figure 6:
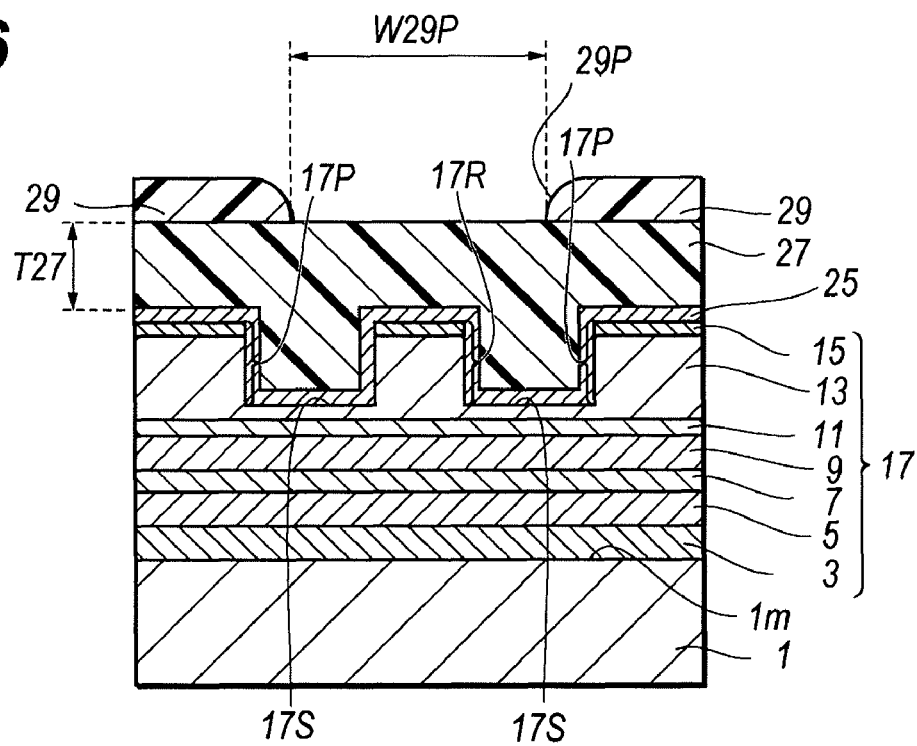
FIG. 6 schematically shows a process for the LD subsequent to that shown in FIG. 5, in which grooves between the striped structure and the terrace structures are fully filled by a resin layer whose top is formed in planar, and patterned on the planar surface of the resin is photo-resist.

The spin-coating of Benzo-cyclo-butene (BCB), which is a type of resin containing silicon (Si), on the insulating layer 25 may flatten the ridge 17R, the terrace 17P, and the groove 17S as shown in FIG. 6; that is, the BOB 27 fully buries the grooves 17S, and covers the top of the ridge 17R and the terrace 17P, and a portion of the BOB 27 thus burying the groove 17S. The BOB 27 has a thickness T27 of 1.2 to 1.5 μm in regions of the ridge 17R and the terraces 17P, which may be determined so as to leave an enough BCB 27 after the exposure of the insulating layer 25.

Formed on the BCB 27 is another patterned photo-resist 29 which has an opening 29P in a portion above the ridge 17R. The opening 29P extends along the X-direction and has a constant width along the Y-direction, which traces the arrangement of the ridge 17R. The width of the opening 29P along the Y-direction is, for instance, 5.0 to 10.0 μm. The photo-resist pattern 29 may be formed by a conventional lithography technique with the spin-coating, the exposure and the developing. The photo-resist 29 may be made of material free from Si or material containing Si but a concentration thereof is less than that of the BOB 27.

(Partially Etching)

Figure 7:
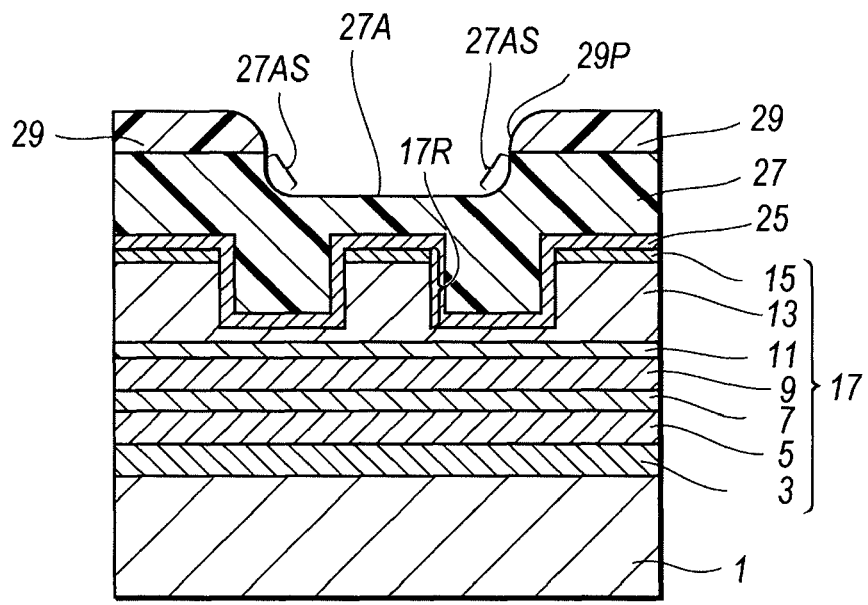
FIG. 7 schematically shows a process for the LD subsequent to that shown in FIG. 6, in which the resin is partially etched in a region above the striped structure.

Subsequently, as shown in FIG. 7, the reactive ion etching (RIE) using a mixture of $CF_4$ with $O_2$ as a reactive gas may partially etch the BCB 27 by the patterned photo-resist 29 as the etching mask so as not to expose the surface of the insulating layer 25. Because the BCB layer 27 contains silicon by an amount greater than that of the photo-resist, the etching rate thereof by $CF_4$ becomes greater than that for the photo-resist 29. Moreover, the reaction gas of the present embodiment contains oxygen ($O_2$) in addition to $CF_4$; then, $O_2$ generates silicon oxide compounds during the reactive etching and this silicon oxide compounds may be effectively removed by $CF_4$, which may enhances the etching rate for the material containing silicon. On the other hand, in a condition that the reaction gas only contains oxygen ($O_2$), the etching rate for the photo-resist 29 that is free from Si or containing silicon (Si) by an amount relatively smaller than that of the BCB 27 may be enhanced.

Accordingly, an adequate selection of the ratio of the partial pressure for $CF_4$ to that of $O_2$ may realize the etching of the BCB layer 27 selectively to the photo-resist 29, or the photo-resist 29 selectively to the BCB layer 27, that is, the BCB layer 27 may be partially etched by a preset depth as the photo-resist 29 is not etched or hard to be etched. The ratio of the partial pressure for $CF_4$ to that of $O_2$ according to the present embodiment is preferably from 0.8~to 1.0. When the mixing ratio of the partial pressure for $CF_4$ to that of $O_2$ is 0.8 or greater, a substantial etching rate for the BCB layer 27 may be obtained, while, the ratio of the partial pressure for $CF_4$ to that of $O_2$ is smaller than 0.8, the etching rate for the photo-resist 29 becomes substantial and the opening 29P in the photo-resist 29 is widened.

The RIE thus carried out may form a hollow 27A in the BCB layer 27. This hollow 27A extends along the X-direction and may maintain the cross section thereof along the X-direction. The side 27AS of the hollow 27A shows a steep edge in an upper portion thereof but it is dulled in a lower portion by the shadow effect inherently attributed to the RIE.

(Widening of Opening)

Figure 8:
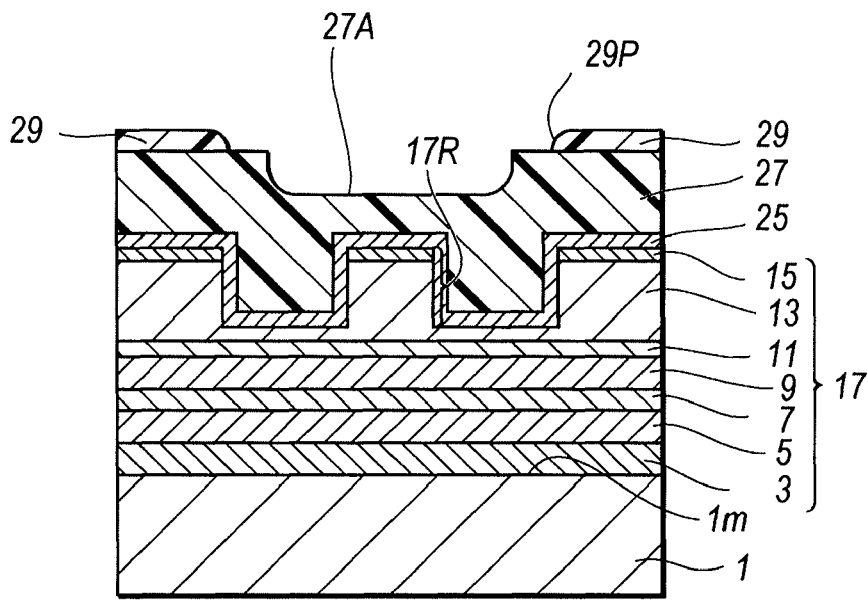
FIG. 8 schematically shows a process for the LD subsequent to that shown in FIG. 7, in which the patterned photo-resist is partially etched to widen an opening thereof.

Continuous to the partial etching of the BCB layer 27, the process widens the opening 29P of the photo-resist 29 as shown in FIG. 8. Another adequate ratio of the partial pressure for $CF_4$ to that of $O_2$ may selectively etch the photo-resist 29, which may expand the opening 29P in two directions parallel to the primary surface 1m. Although FIG. 8 illustrates that the photo-resist 29 is expanded only along the Y-direction, the opening 29P is also widened along the X-direction. In this process, the mixing ratio of respective gaseous, that is, a ratio of partial pressure for $CF_4$ to that of $O_2$ is set such that the etching rate for the BCB layer 27 is far smaller or substantially zero compared to that for the photo-resist 29. The ratio of the partial pressure for $CF_4$ to that of $O_2$ is preferably from 0.2 to 0.33. When the partial pressure for $CF_4$ is equal to or smaller than 0.2, the BCB layer 27 is hard to be etched, while, the etching for the photo-resist 29 is enhanced.

Figure 9:
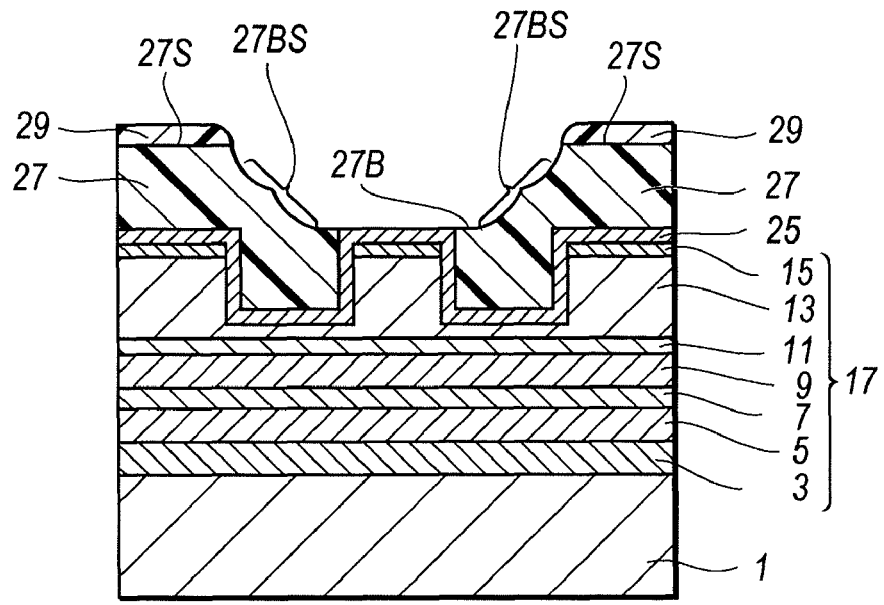
FIG. 9 schematically shows a process for the LD subsequent to that shown in FIG. 8, in which the resin layer is etched again to expose the inorganic layer on the top of the striped structure.
Figure 10:
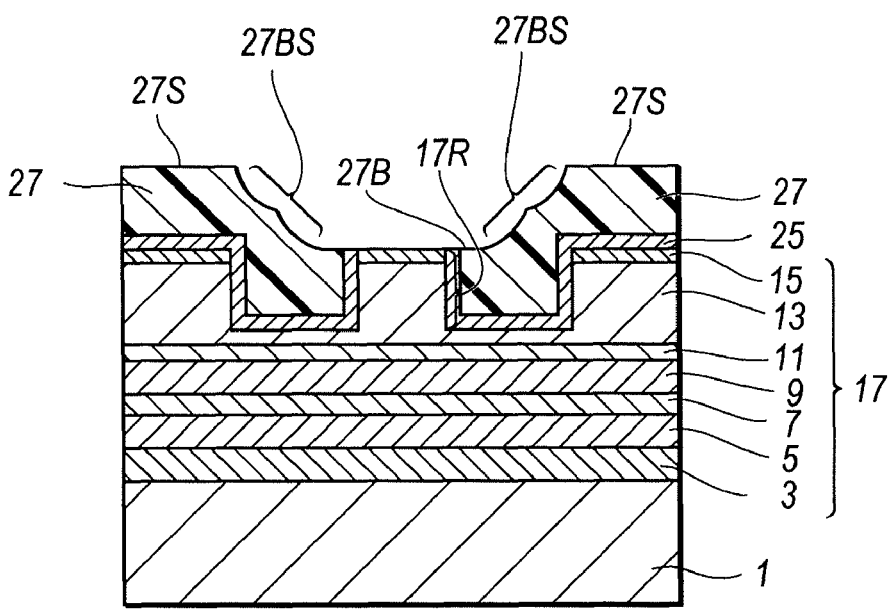
FIG. 10 schematically shows a process for the LD subsequent to that shown in FIG. 9, in which the inorganic layer on the top of the striped structure is removed to expose the top of the striped structure.

Subsequently, the process exposes the insulating layer 25 in the top of the ridge 17R by etching the BCB layer 27 left in the first etching with the RIE technique using the mixed gas of $CF_4$ with $O_2$ as shown in FIG. 9. The photo-resist 29, which is left on the BCB layer 27 and widened in the opening 29P thereof by the second etching, is used as the etching mask. Selecting the ratio of the partial pressure for $CF_4$ to that of $O_2$, the selective etching for the BCB layer 27 may be carried out. This gaseous condition may also suppress the etching rate for the insulating layer 25. This third etching for the BCB layer 27 and the photo-resist 29 may form the opening 27B in the BCB layer 27 from the top surface 27S thereof as shown in FIG. 9. The opening 27B extends along the X-direction and has a constant cross section. As described before, the process according to the present embodiment first forms the hollow 27A as illustrated in FIG. 7, which form a portion of the opening 27B, second widens the opening 29P in the photo-resist 29, and third exposes the top surface of the insulating layer 25 to form the opening 27B by the mixed gaseous of $CF_4$ with $O_2$. Accordingly, the opening 27B has further dulled side wall 27BS compared to that of the in-process opening 27AS. When the opening 27B of the BCB layer 27 is formed by the one time etching; that is first etching shown in FIG. 7 exposes the top of the insulating layer 25, the side of the opening 27B must show a steep edge as the edge of the opening 27A shown in FIG. 7.

(Removal of Photo-Resist)

Subsequently, the ashing using $O_2$ or the organic solvent may remove the photo-resist left 29 to expose the top surface 27S of the BCB layer 27. The reactive etching using only carbon fluoride ($CF_4$) may etch the insulating layer 25 on the top of the ridge waveguide 17R exposed in the bottom of the opening 27B. The top of the ridge 17RS may be exposed. When the insulating layer 25 is made of silicon oxide ($SiO_2$), the removal of photo-resist 29 left on the BCB layer 27 is preferably carried out after the exposure of the insulting layer 25 and before the exposure of the top of the ridge 17RS, because the etching of the insulating layer 25 that contains silicon may etch the BCB layer 27 too, which further widens the opening 27B; accordingly, the side 27BS of the opening 27B may be further dulled.

(Wiring)

Figure 11:
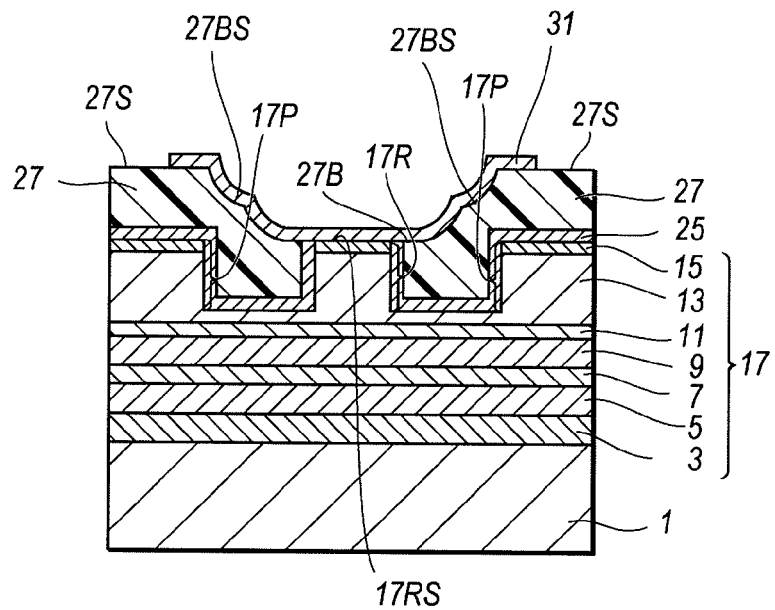
FIG. 11 schematically shows a process for the LD subsequent to that shown in FIG. 10, in which the wiring is formed so as to come in electrically contact with the top of the striped structure and to extend on the top of the resin layer as traversing the dulled side surface of the opening in the resin layer.
Figure 12:
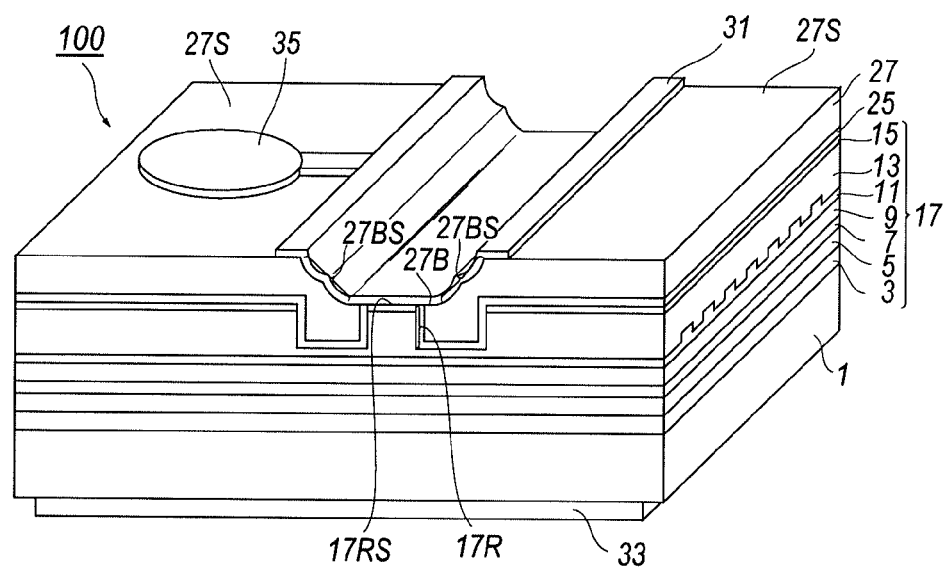
FIG. 12 is a perspective view to show the LD thus formed in the previously described processes.

Subsequently, as illustrated in FIG. 11, the process forms a wiring 31 extending from the top 17RS of the ridge 17R to the top surface 27S of the BCB layer 27 as traversing the edge of the opening 27B by, for instance, the metal evaporation. The wiring 31 makes an ohmic contact with the contact layer 15 on the top of the ridge 17R. The BCB layer 27 preferably has a thickness in the terrace 17P at least 1 μm to protect the ridge 17R securely. Moreover, the BCB layer 27 in the terrace 17P may make the wiring 31 apart from the contact layer 15 enough, which reduces the parasitic capacitance attributed between the wiring 31 and the contact layer 15 and enables the LD to be driven by high frequencies. The LD of the present embodiment has the layer 27 made of BCB, which shows a smaller dielectric constant and a higher transmittance for light with wavelengths from 1.3 to 1.5 μm; accordingly, the LD thus processed shows a smaller parasitic capacitance and may be directly driven by high frequency signals in the optical communication system.

Finally, the process forms the upper pad 35 on the BCB layer 27 and the other electrode 33 on the back surface of the substrate 1 by the vacuum evaporation after the substrate is thinned. Thus, the LD 100 with the ridge waveguide structure is completed. A feature of the LD 100 is that the BCB layer 27 has the opening 27B in the top of the ridge 17R, and this opening 27B has the dulled side surface, that is, the width of the opening 27B along the Y-direction gradually increases from the top 17RS of the ridge 17R. Moreover, the BCB layer 27 buries the whole ridge 17R as illustrated in FIG. 6; the ridge 17R may be isolated from the terrace 17P by the grooves 17S therebetween. The dulled side surface 27BS of the opening 27B, which facilitates the wiring 31 formed thereof, may effectively prevent the breakage of the wiring at the edge of the opening as illustrated in FIG. 11.

The opening 27B in the BCB layer 27 is formed by the sequential etching by the RIE using the mixed gas of $CF_4$ and $O_2$. The ratio of the partial pressures for $CF_4$ to that for $O_2$ may be adequately adjusted in respective etching, specifically, the first etching for the BCB layer 27 sets the ratio of the partial pressure for $CF_4$ such that the etching rate for the BCB layer 27 is greater than that of the photo-resist 29; the second etching is performed in a condition where only the photo-resist 29 is etched by reducing the ratio of the partial pressure for $CF_4$; and the third etching for the BCE layer 27 is carried out under a condition where both the BCB layer 27 and the photo-resist 29 are etched. Thus, the opening 27B of the BCB layer 27 with the dulled side surface may be obtained only by varying the ratio of the partial pressure for $CF_4$ with respect to that of $O_2$.

Second Embodiment

Next, another process and structure of an LD with the buried hetero-structure will be described as the second embodiment of the present invention.

Figure 13:
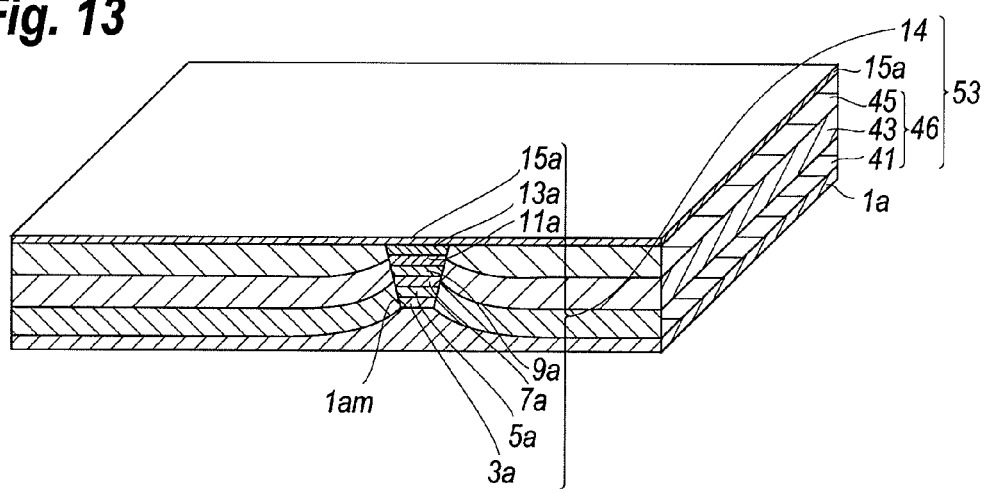
FIG. 13 schematically shows a process for the LD according to the second embodiment of the invention, in which a mesa including the active layer and a burying layer burying the mesa are formed.
Figure 14:
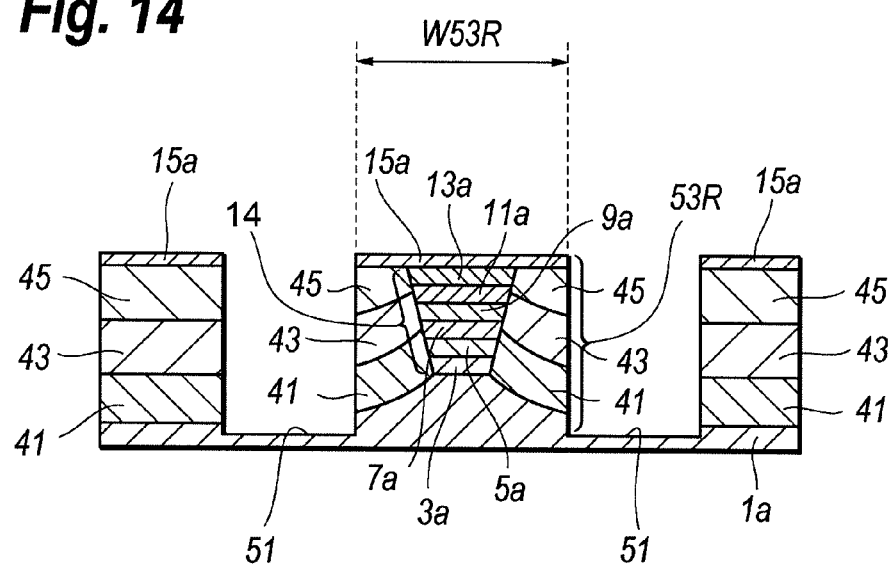
FIG. 14 schematically shows a process for the LD subsequent to that shown in FIG. 13, in which a striped structure including the mesa and a portion of the burying layer is formed.
Figure 15:
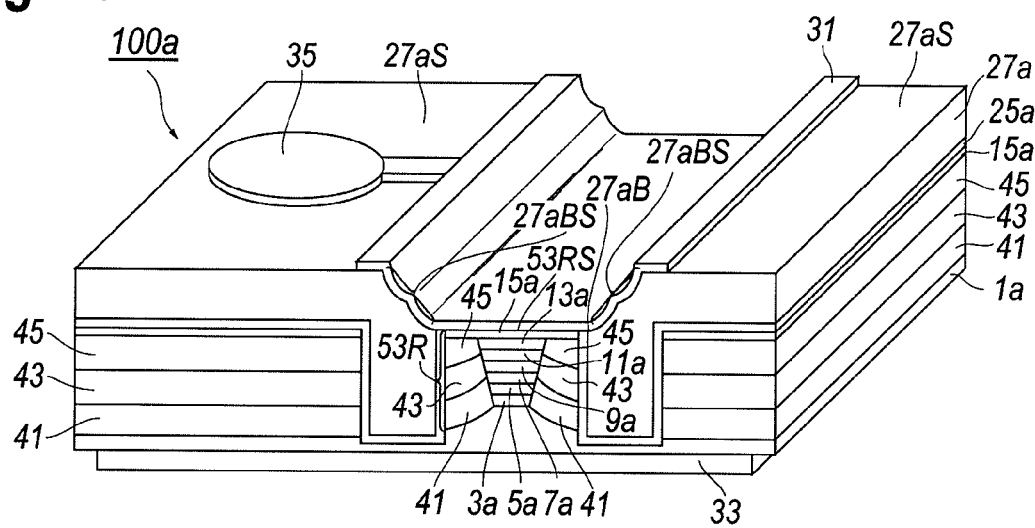
FIG. 15 is a perspective view showing the LD formed by processes described above according to the second embodiment of the invention.

The process is different from those of the first embodiment in points of the layer growth and the formation of the striped structure. FIG. 13 schematically illustrates a process to stack semiconductor layers for the other LD according to the second embodiment of the invention; FIG. 14 shows a process to from the striped structure; and FIG. 15 is a perspective view of the completed LD 100a of the second embodiment.

(Layer Growth)

As illustrated in FIG. 13, the stacking of the semiconductor layers includes, on the primary surface 1am of the semiconductor substrate 1a, a lower cladding layer 3a, a lower optical confinement layer 5a, an active layer 7a, an upper optical confinement layer 9a, a grating layer 11a and an upper cladding layer 13a in this order. These layers, 3a to 13a, may be grown by the MOCVD technique as those layers, 3 to 15, in the first embodiment. The materials constituting the layers, 1a to 13a, are the same with those in the first embodiment.

Subsequent to the growth of the layers, the process forms a mesa 14 by etching the upper cladding layer 13a, the grating layer 11a, the upper optical confinement layer 9a, the active layer 7a, the lower optical confinement layer 5a, the lower cladding layer 3a and a portion of the substrate 1a. The process buries the mesa 14 by filling the etched region in both sides of the mesa 14 with the first burying layer 41, the second burying layer 43 and the third burying layer 45. The first burying layer 41 may be made of InP with the second conduction type, when the substrate is n-type InP as that of the first embodiment, the second conduction type is the p-type; the second burying layer 43 may be made of InP with the first conduction type; and the third burying layer 45 may be made of InP with the second conduction type. The tri-layers of the first to third burying layers, 41 to 45, constitute the carrier confinement structure 46. After the formation of the carrier confinement structure 46, the process grows the contact layer 15, which may be also made of material same with that of the first embodiment, on the top of the mesa 14 and the top of the carrier confinement structure 46. The mesa 14, the carrier confinement structure 46 and the contact layer 15a collectively form the semiconductor structure 53 corresponding to the stacking 17 in the first embodiment.

(Stripe Formation)

As shown in FIG. 14, the process according to the present embodiment forms a pair of trenches 51 in both sides of the mesa 14 by etching the contact layer 15a, the third to first burying layers, 45 to 41, and a portion of the semiconductor substrate 1a. The trenches 51 corresponds to the grooves 17S in the first embodiment and extends along the X-direction with a constant width along the Y-direction. The trenches 51 put the mesa 14 therebetween so as to form the striped structure 53R corresponding to the ridge 17R in the first embodiment and extending along the X-direction with a constant width W53R along the Y-direction. This width W53R of the striped structure is preferably greater than 3 μm and less than 4 μm from a viewpoint of the reduction of parasitic capacitance.

Other processes according to the present embodiment are similar to those of the first embodiment, or may be carried out by techniques same with or similar to those described in the first embodiment. Thus, as shown in FIG. 14, the LD 100a with the buried hetero-structure shown in FIG. 15 is completed. In this LD 100a, the BCB layer 27a, which corresponds to the BCB layer 27 in the first embodiment, also provides an opening 27aB extending from the top surface 27aS thereof to the top 53RS of the striped structure 53R as traversing the edge of the opening 27aB. Moreover, as those of the first embodiment, the sides 27aBS has a dulled surface with respect to the top surface 27BS of the BCB layer and to the top 53RS of the striped structure 53R; accordingly, the process according to the present embodiment may prevent the wiring 31 formed on the BCB layer 27aS from breaking at the edge of the opening 27aB.

While there has been illustrated and described what are presently considered to be example embodiments of the present invention, it will be understood by those skilled in the art that various other modifications may be made, and equivalents may be substituted, without departing from the true scope of the invention. For instance, the process according to the embodiments described above removes the patterned photo-resist 29 after the exposure of the top of the insulating layer 25 and before the exposure of the contact layer 15 in the top of the ridge, refer to FIGS. 9 and 10, but the process may remove the patterned photo-resist 29 after the exposure of the contact layer 15 on the top of the ridge 17R. This modified process may form the side 27BS of the BCB layer 27 in further dull with respect to the top 27S of the BCB layer, which may effectively prevent the wiring 31 from breaking at the edge of the opening 27B. Therefore, it is intended that the present invention not be limited to the particular embodiments disclosed, but that the invention include all embodiments falling within the scope of the appended claims.

What is claimed is:

1. A method to form a semiconductor laser diode, comprising steps of:
forming a striped structure including a semiconductor stack having a plurality of semiconductor layers;
covering said striped structure with an inorganic layer containing silicon;
burying said striped structure and said inorganic layer by a resin so as to make a top surface of said resin planar, said resin containing silicon in a concentration; and
forming an opening in said resin and said inorganic layer at a portion on said striped structure by a photo-resist as an etching mask, said photo-resist being free from silicon or containing silicon in a concentration less than said concentration in said resin,
wherein said formation of said opening including steps of,
etching said resin partially by a reactive ion etching with a mixed gas of $CF_4$ and $O_2$ under a first ratio of a partial pressure for said $CF_4$ to a partial pressure for $O_2$,
etching said photo-resist partially by said reactive ion etching with a mixed gas of $CF_4$ and $O_2$ under a second ratio of a partial pressure for $CF_4$ to a partial pressure for $O_2$, said second ratio being less than said first ratio,
etching said resin by said reactive ion etching with a mixed gas of $CF_4$ and $O_2$ under a third ratio of a partial pressure for $CF_4$ to said $O_2$, said third ratio being greater than said second ratio, and
etching said inorganic layer by said reactive ion etching with a mixed gas of $CF_4$ and $O_2$ under a fourth ratio of a partial pressure for $CF_4$ to a partial pressure for $O_2$.

2. The method of claim 1, wherein said resin layer is made of benzo-cycro-butene.

3. The method of claim 1, wherein said inorganic layer is made of silicon oxide.

4. The method of claim 1, wherein said formation of said opening is carried out such that said opening has a dulled side surface at an edge thereof.

5. The method of claim 1, wherein said first ratio of said partial pressure for $CF_4$ ranges from 0.8 to 1.0 with respect to said partial pressure of $O_2$.

6. The method of claim 1, wherein said second ratio of said partial pressure for $CF_4$ ranges from 0.2 to 0.33 with respect to said partial pressure of said $O_2$.

7. The method of claim 1, wherein said third ratio of said partial pressure for $CF_4$ ranges from 0.8 to 1.0 with respect to a partial pressure of $O_2$.

8. The method of claim 1, wherein said striped structure is a ridge waveguide structure provided on an active layer for emitting light.

9. The method of claim 1, wherein said striped structure includes a semiconductor mesa with an active layer for emitting light and a plurality of burying layers provided in both sides of said mesa, said mesa and said burying layers constituting a carrier confinement structure.

10. The method of claim 1, wherein said inorganic layer has a thickness from 200 to 400 nm.

11. The method of claim 1, wherein said resin has a thickness of 1.2 to 1.5 μm at a portion above said striped structure before said partial etching for said resin is firstly carried out.

12. The method of claim 1, further comprising a step of removing said photo-resist after said etching for said inorganic layer is carried out.

13. The method of claim 1, further comprising a step of removing said photo-resist after said etching for said resin again and before said etching for said inorganic layer.

14. The method of claim 1, further comprising a step of forming a wiring made of metal so as to cover said opening formed in said resin and said inorganic layer, said wiring coming in electrical contact with said semiconductor stack and extending on a surface of said resin by traversing an edge of said opening.

* * * * *